(12) United States Patent
Kemmochi et al.

(10) Patent No.: US 8,496,752 B2
(45) Date of Patent: Jul. 30, 2013

(54) METHOD AND APPARATUS FOR VENTING GAS BETWEEN A CRUCIBLE AND A SUSCEPTOR

(75) Inventors: Katsuhiko Kemmochi, Camas, WA (US); Robert Joseph Coolich, North Bonneville, WA (US); Michael Randall Fallows, Vancouver, WA (US)

(73) Assignee: Heraeus Shin-Etsu America, Inc., Camas, WA (US)

( * ) Notice: Subject to any disclaimer, the term of this patent is extended or adjusted under 35 U.S.C. 154(b) by 958 days.

(21) Appl. No.: 12/552,960

(22) Filed: Sep. 2, 2009

(65) Prior Publication Data

US 2011/0048315 A1    Mar. 3, 2011

(51) Int. Cl.
*C30B 15/02*    (2006.01)

(52) U.S. Cl.
USPC ............... 117/13; 117/20; 117/21; 117/213; 117/215

(58) Field of Classification Search
USPC .................. 117/13, 20, 21, 213, 215
See application file for complete search history.

(56) References Cited

U.S. PATENT DOCUMENTS

2010/0154703 A1*   6/2010   Tsuji et al. ............. 117/208

FOREIGN PATENT DOCUMENTS

| JP | 2005-225718 A | 8/2005 |
|---|---|---|
| JP | 2008-201619 A | 9/2008 |

* cited by examiner

*Primary Examiner* — Bob M Kunemund
(74) *Attorney, Agent, or Firm* — Marger Johnson & McCollom PC

(57) ABSTRACT

During a CZ or similar process, a silica crucible is held in a graphite or similar susceptor while being heated to above between about 1580 and 1620 degrees C. Vents or grooves formed in at least one of the outer surface of the crucible and the inner surface of the susceptor permit gasses to vent upwardly and out from between the crucible and susceptor. This permits gas evolved from the crucible as a result of the heat to be vented rather than expanding between the crucible and susceptor thereby deforming the crucible.

20 Claims, 11 Drawing Sheets

METHOD AND APPARATUS FOR VENTING GAS BETWEEN A CRUCIBLE AND A SUSCEPTOR

BACKGROUND

1. Field of the Invention

The present invention relates generally to crucibles and crucible susceptors and methods of making the same and more particularly to such crucibles and susceptors used to melt silicon in a furnace.

2. Description of the Related Art

There are several methods for making single crystal materials. One such method—the Czochralski (CZ) process—has been widely adopted for producing single crystal materials for semiconductor applications such as integrated circuits and solar cells. In the CZ process, molten silicon is contained within a vessel, and a tip of a single-crystalline seed crystal is dipped into the molten silicon. The seed crystal is slowly pulled from the melt while being rotated. As a result, the melted silicon forms a single crystal silicon ingot around the seed crystal.

A fused quartz crucible is one vessel commonly employed to contain molten silicon in the CZ process. Such a crucible is generally in the shape of a bowl and is held by a susceptor during the melting and pulling of the crystal. The susceptor is typically made of a carbon element such as graphite or is a carbon composite.

At the start of the CZ process, a silica glass crucible that contains a solid silicon charge is placed inside the susceptor at room temperature. Although the susceptor is also bowl shaped to hold and support the crucible, there is a small gap between most of the outer surface of the crucible and the inner surface of the susceptor to permit the crucible to be inserted into the susceptor. Next, the susceptor is placed in a furnace, and heaters surrounding the susceptor are activated to begin melting the silicon, which melts at 1414 degrees C.

Heating continues until the silicon in the crucible is fully melted, i.e., in liquid form. The surface of the melted silicon is well below the top of the crucible. (A plane containing the top surface of the melted silicon is referred to herein as the melt plane.) As a result of the high temperature, the crucible softens. In addition, the weight of the silicon melt presses the outer surface of the crucible below the melt plane firmly against the inner surface of the susceptor. At this stage, there is virtually no gap between the crucible and the susceptor below the melt plane. Above the melt plane, however, the gap remains because the temperature is lower and because the melted silicon is not urging the crucible outwardly.

Once the silicon is completely melted, the seed crystal is dipped into the melt and slowly pulled therefrom while being rotated. It is important to control the rate of withdrawal because changes in the rate produce changes in the diameter of the single crystal ingot that is formed around the seed crystal. If the crystal structure is sufficiently disturbed, it may be necessary to start again.

In the past it was necessary to keep the temperature just high enough to maintain the silicon in its melted condition. Any higher temperatures tended to cause impurities from the crucible or from the refractory materials to be released into the atmosphere or, in the cased of the crucible, directly into the silicon melt.

More recently, improvements in manufacturing of the crucible, susceptor, and other refractory materials have improved their purity. This permits operating at somewhat higher temperatures without the defects associated with less pure materials. As a result, processors have increased the furnace temperature during the CZ process, especially during the melt down process, to speed up throughput. This is especially true for manufacturers of solar cells, which can be less chemically pure than the silicon used for integrated circuits.

But unexpected losses in the crystal structure were encountered at these higher temperatures, starting at between about 1580 and 1620 degrees C., even when using crucibles and refractory materials having a high purity. The assignee of the present application investigated these losses and discovered that at these higher temperatures, gas is evolved from the outer surface of the silicon crucible below the melt plane. This gas may include silicon oxide, carbon monoxide, and/or carbon dioxide. Because the outer crucible surface is effectively sealed against the inner susceptor surface, the evolved gas blows up the crucible wall into the melt, which changes the position of the melt surface. Although this elevation of the melt plane is most prevalent during the melting process, the elevated melt level may change while the ingot is pulled. This change produces an effect similar to changing the pull rate, and in some cases, crystal structure of the ingot is lost.

This problem is accentuated for larger crucibles. In such crucibles, the heaters, which surround the susceptor, must be set to generate a high enough temperature to maintain the silicon in a melted condition at the center of the crucible. It is apparent that the temperature drop between the outermost portions of a larger crucible to the center thereof is larger than for a smaller crucible. This results in higher heating of the periphery of the larger crucibles, which in turn increases the likelihood that the wall of the crucible will blow inwardly as described above.

DETAILED DESCRIPTION

Figure 1:
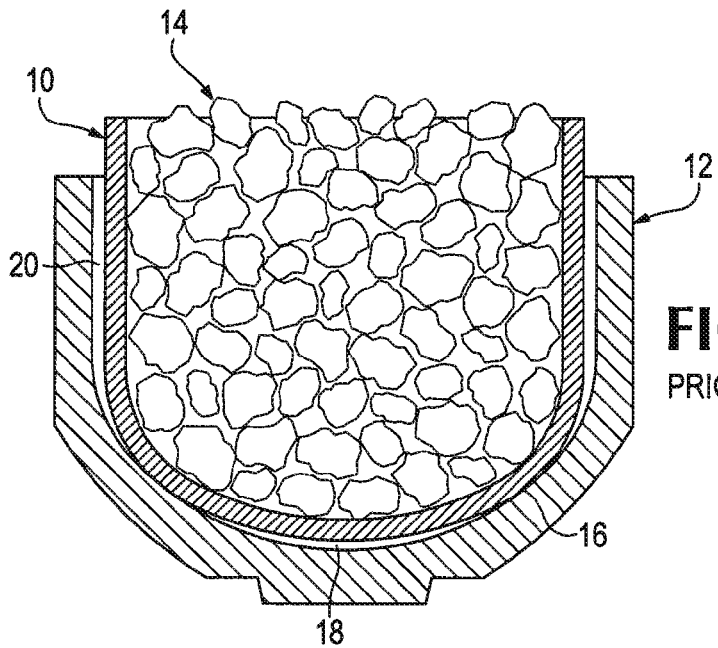
FIG. 1 comprises a prior art sectional view of a susceptor and crucible with a solid silicon charge.

Turning now to FIG. 1, a fused quartz crucible 10 is held by a graphite susceptor 12. Crucible 10 contains chunks of solid silicon, indicated generally at 14. The outer surface of crucible 10 contacts the inner surface of susceptor 12 at a band 16 that extends about the circumference of the crucible. Band 16 is a surface in the shape of a partial toroid. Below band 16 is a first gap 18 between the crucible and the susceptor and above band 16 is a second gap 20. These relative shapes of the crucible and the susceptor permit the crucible to be easily received into the susceptor at the start of the CZ process before heating begins.

After the susceptor, crucible, and silicon chunks are assembled as in FIG. 1, the assembly is placed inside a furnace (not shown). Heaters (also not shown) in the furnace are concentrated outside of susceptor 12 near band 16.

Figure 2:
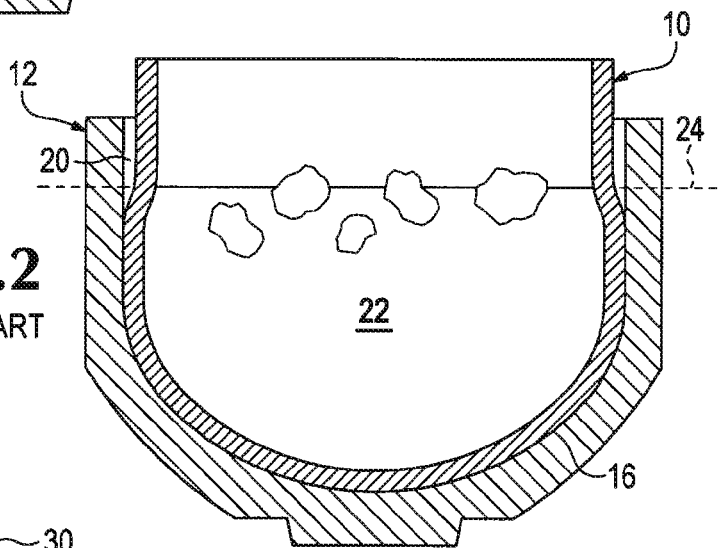
FIG. 2 is a view similar to FIG. 1 with the silicon charge partially melted.

In FIG. 2, after the heaters are turned on, the silicon begins to melt once the temperature in the furnace reaches about 1414 degrees Centigrade. The view of FIG. 2 depicts a silicon melt 22 that results from melting of most of the silicon chunks 14 with only a few remaining. A plane containing the top surface of silicon melt 22 is referred to herein as the melt plane 24. The heat from the furnace softens crucible 10. That combined with the weight of silicon melt 22 results in the outer surface of the crucible pressing against the inner surface of the susceptor substantially everywhere beneath melt plane 24. In other words, gap 18 no longer exists beneath melt plane 24, but gap 20 above the melt plane remains.

Figure 3:
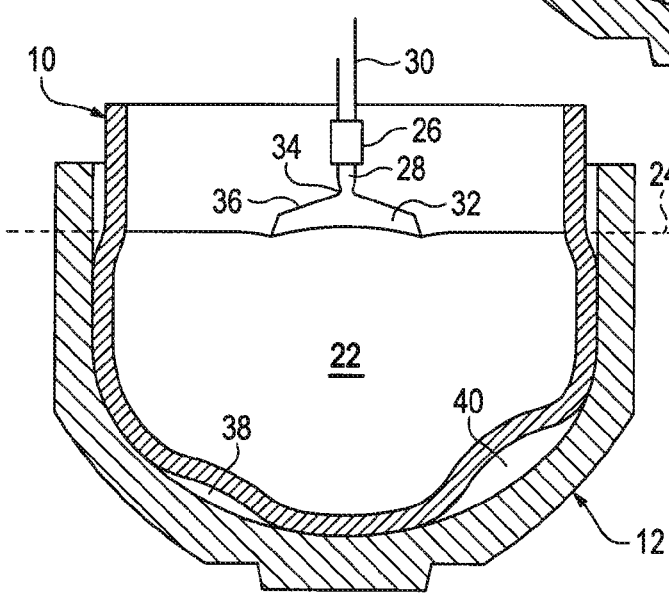
FIG. 3 is a view similar to FIG. 2 after the charge is completely melted and formation of a silicon ingot has begun.

In FIG. 3, a chuck 26 receives and holds a seed crystal 28. The chuck is held by a shaft 30 that rotates and lifts upwardly in accordance with precise controls (not shown). A single crystal silicon ingot 32 is formed from the silicon melt around the seed crystal in the chuck. This process is started by lowering rod 30 until seed crystal 26 is received in the silicon melt and then rotating the rod and gradually withdrawing it from the melt. The process is controlled to form a neck 34, a shoulder 36, and then the body of ingot 32 until most of the melt is gone, at which point the CZ process is substantially completed.

Also shown in FIG. 3 are gas pockets 38, 40 that are formed from gas evolved from the outer surface of crucible 10 after gap 18 is sealed against susceptor 12 and the temperature climbs to about 1580-1620 degrees Centigrade. This higher temperature is desirable from one standpoint: it produces a quicker meltdown and thus faster throughput, i.e., the entire CZ process is shortened, even when an ingot is pulled at the same rate. On the other hand, the high temperature also creates gas pockets, like gas pockets 38, 40. As they form, the volume of crucible 10 below melt plane 24 decreases. This moves the melt plane upwardly relative to whichever one of seed 28, neck 34, shoulder 36, or ingot 32 is at the surface of melt 22. As a result, formation of the single silicon crystal may be adversely affected.

Figure 4:
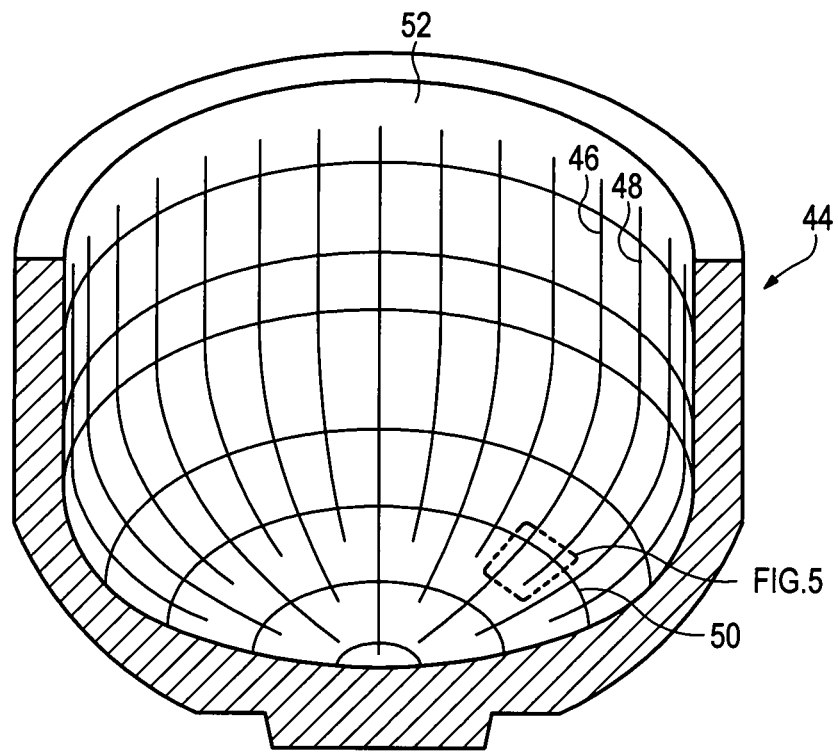
FIG. 4 is a perspective cross-sectional view of an embodiment of a susceptor.
Figure 5:
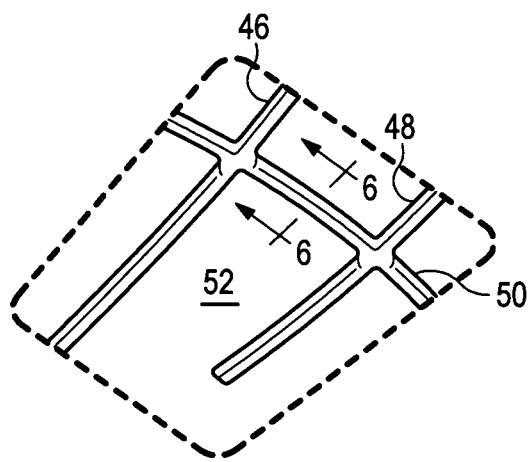
FIG. 5 is an enlarged portion of the view of FIG. 4.

Turning to FIGS. 4 and 5, indicated generally at 44 is a cross-sectional perspective view of a susceptor constructed in accordance with the present invention. As is known in the art, the susceptor may be structured from multiple pieces that are fit together to form a bowl-shaped structure to hold a crucible. Susceptor 44 includes a plurality of grooves, like grooves 46, 48, 50 formed on the inner surface 52 thereof. It has been found through experiments, which are described shortly, that if any point on surface 52 of the susceptor beneath melt plane 24 is no more than 25 mm from the nearest groove, like grooves, 46, 48, 50, that gas evolved from a crucible (not shown) held by susceptor 44 is vented upwardly between the crucible and susceptor 44 until it is above the melt plane, like melt plane 24 in FIG. 2. This prevents formation of gas pockets, like gas pockets 38, 40 in FIG. 3. The vertical grooves, like grooves 46, 48 in susceptor 44, need to extend above the melt plane of a crucible held therein, but does not require extension beyond that for gas to vent upwardly from the grooves.

Figure 6:
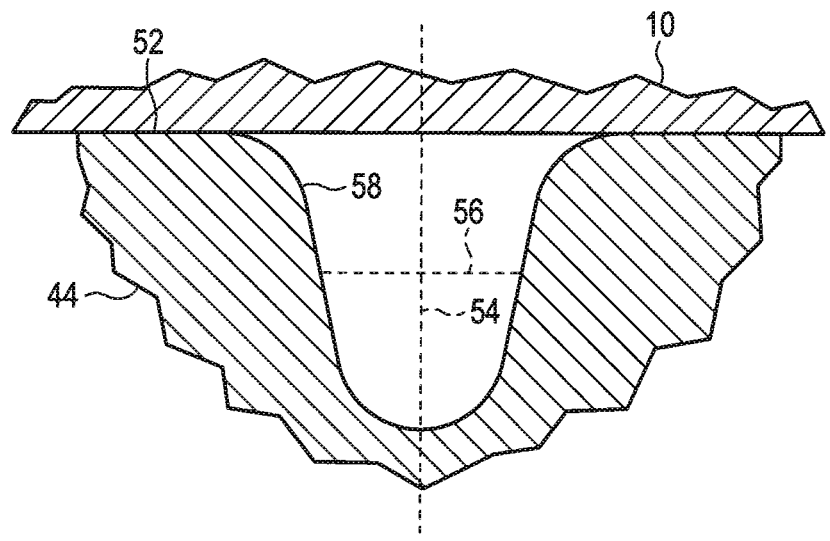
FIG. 6 is an enlarged view taken along line 6-6 in FIG. 5 with the susceptor holding a crucible.

In FIG. 6 crucible 10 is received in susceptor 44. The depth of the groove is measured from surface 52 of the susceptor, which is substantially coplanar with the outer surface of crucible 10 in FIG. 6. An axis 54, along which the depth is measured, symmetrically divides groove 46. A second axis 56, is normal to the first axis half way between the outer surface of crucible 10 and the point at which axis 54 intersects with susceptor 44 at the bottom of groove 46. Groove width for groove 46 and for other grooves depicted herein is measured along axis 56. In FIG. 6, the crucible has been heated to the point that the outer surface of the crucible is substantially conformed to the inner surface of susceptor 44, as shown in FIG. 2. But it is not heated to the point where groove 46 begins to be filled as will be shortly described.

Figure 7:
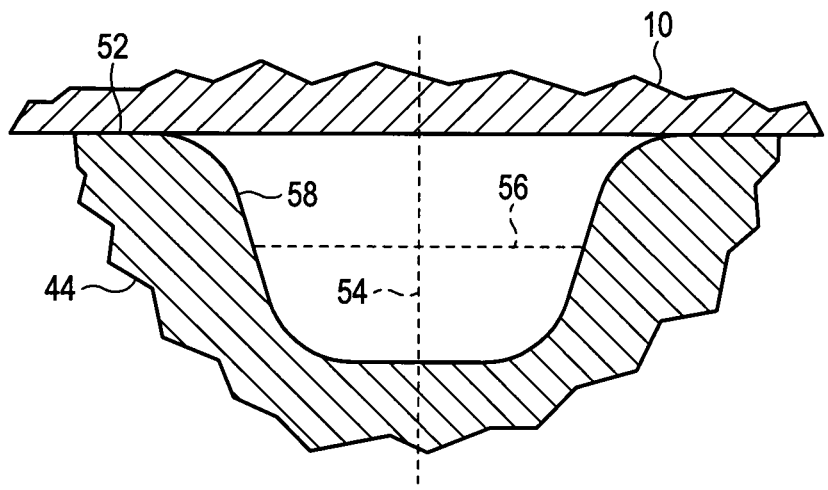
FIG. 7 is a view similar to FIG. 6 of an alternative embodiment.
Figure 8:
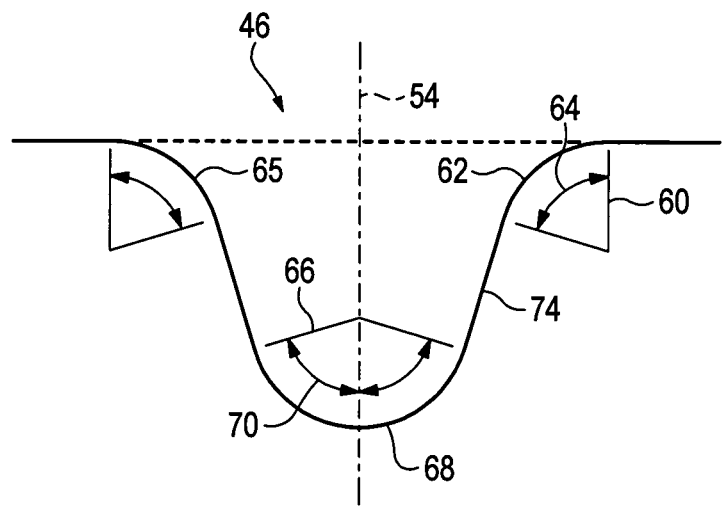
FIG. 8 is a line drawing depicting the shape of the embodiment of FIG. 6.
Figure 9:
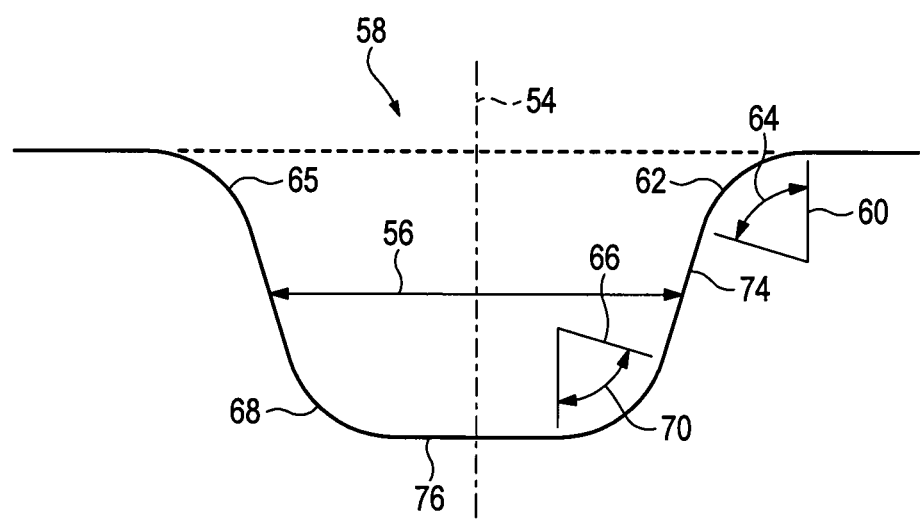
FIG. 9 is a line drawing depicting the shape of the embodiment of FIG. 7.

FIG. 7 is a view similar to FIG. 6, with corresponding numbers that identify corresponding structure, depicting an alternative groove 58. Like groove 46, groove 58 is symmetrical about axis 54. It has been found that having a groove height between 1 and 3 mm and a width between 2 and 10 mm is optimal for preventing gas pockets while maintaining structural integrity of the crucible and preventing the crucible from melting into and blocking the groove during the CZ process. FIGS. 8 and 9 depict the shape of each groove in FIGS. 6 and 7, respectively, and illustrate further groove dimensions.

In FIG. 8, a first radius 60 defines a shoulder 62 over a first arc 64. A second shoulder 65 is symmetrical with the shoulder 62. A second radius 66 defines one-half of a bottom 68 of groove 46 over a second arc 70. The other half of bottom 68 is defined by second radius 66 over a third arc 72, with each of the second and third arcs being equal and symmetrical. Shoulder 60 is connected to bottom 68 via a substantially planar segment 74.

FIG. 9 is a view similar to FIG. 8, with corresponding numbers that identify corresponding structure, depicting the shape of groove 58. Groove 58 includes a substantially planar segment 76 that defines the lowermost portion of bottom 68 and which connects that portion of bottom 68 defined by radius 66 and arc 70 with its symmetrical counterpart.

It has been found that keeping each radius smaller than about 5 mm and each arc greater than about 60 degrees, combined with the height and depth dimensions described in connection with FIGS. 6 and 7 properly vents gas from between the crucible and the susceptor through all stages of the CZ process. Put differently, these parameters permit venting of gasses to avoid gas pockets by preventing the crucible from melting into the susceptor grooves. It should be appreciated that a suitable groove could be implemented with either or both of the substantially planar sections, like sections 74, 76, eliminated. For example, bottom 68 in FIG. 8 does not include a substantially planar portion, like portion 76 in FIG. 9.

Figure 10:
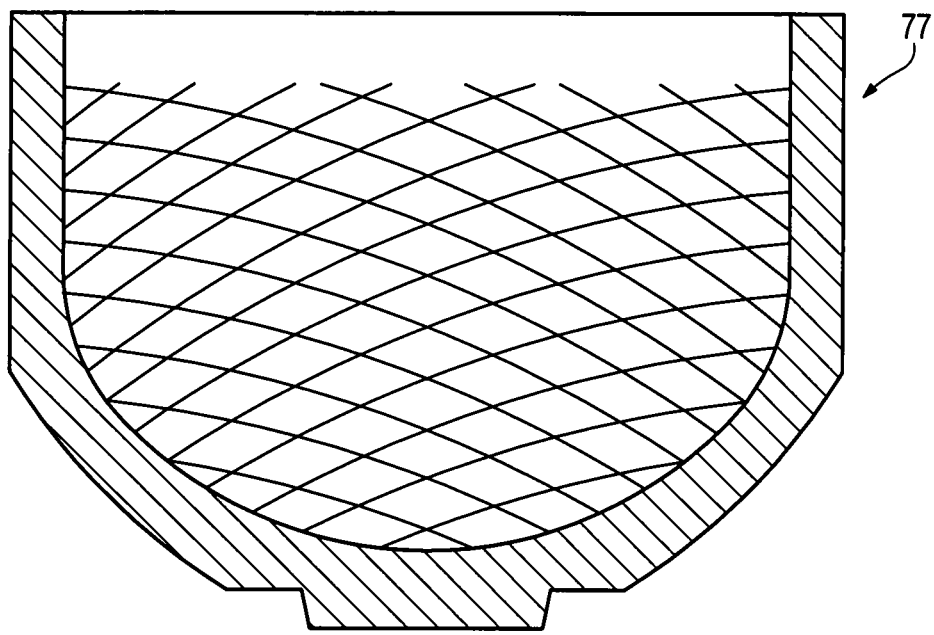
FIG. 10 is a cross-sectional view of an embodiment of another susceptor.

Indicated generally at 77 in FIG. 10 is another embodiment of a susceptor constructed according to the present invention. Susceptor 77 has grooves formed on a lathe. As a result, the grooves form a somewhat helical crossing pattern as shown. The grooves may have generally the same parameters and dimensions as described above.

Figure 11:
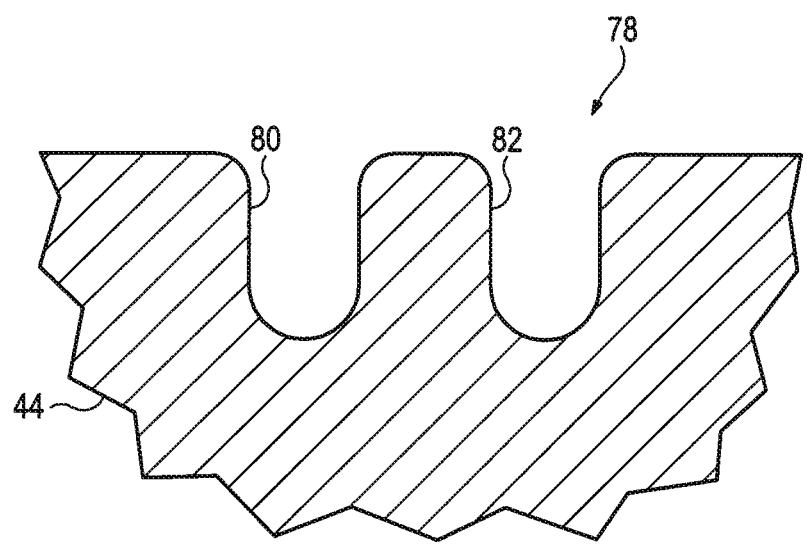
FIG. 11 is a cross-sectional view of another embodiment of a susceptor.

Indicated generally at 78 in FIG. 11 is a view similar to that of FIGS. 6 and 7 showing another embodiment of a groove. Groove 78 includes a pair of channels 80, 82, each of which can be half the depth of a single channel embodiment like those shown in FIGS. 6 and 7. This embodiment provides better structural integrity because the grooves are less deep than a single groove, but the double-groove approach is more expensive to make.

Figure 12:
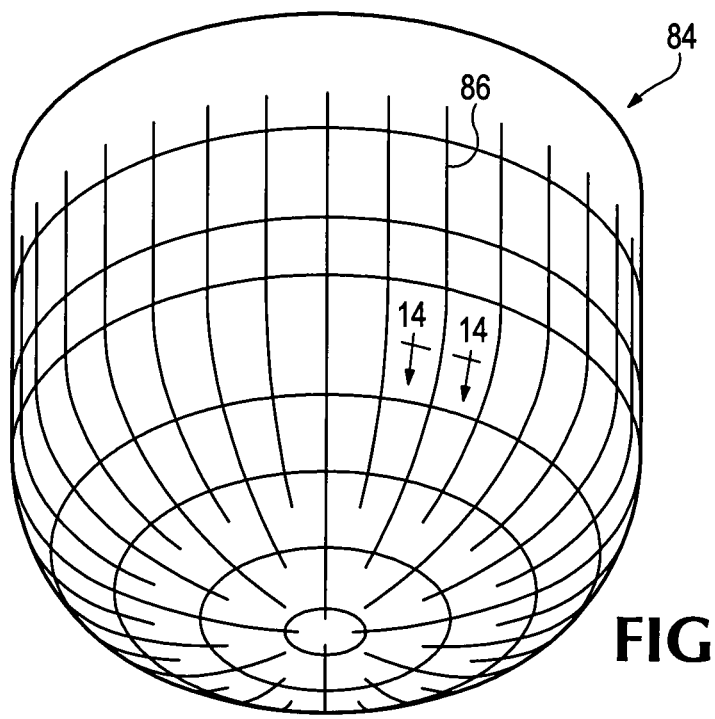
FIG. 12 is a perspective view of an embodiment of a crucible.
Figure 13:
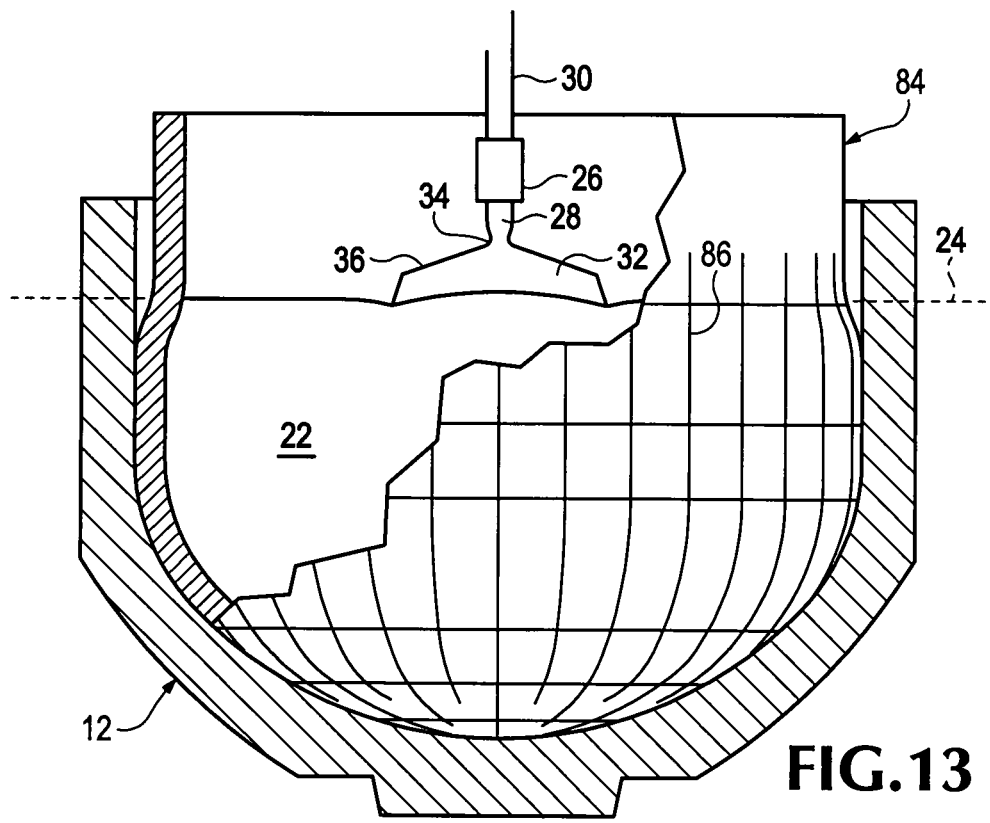
FIG. 13 is a cross-sectional view of the crucible of FIG. 12 in use in a CZ process.

Turning now to FIGS. 12 and 13, indicated generally at 84 is a crucible constructed in accordance with the present invention. Crucible 84 includes a plurality of grooves, like groove 86, formed on the outer surface of the crucible. These grooves may be formed, e.g., by using a stencil and sandblasting. Broadly speaking, the grooves on crucible 86 may have generally the same size and dimensions as described in connection with the susceptor grooves. Following is more detail about implementing the invention using crucible grooves.

Figure 14:
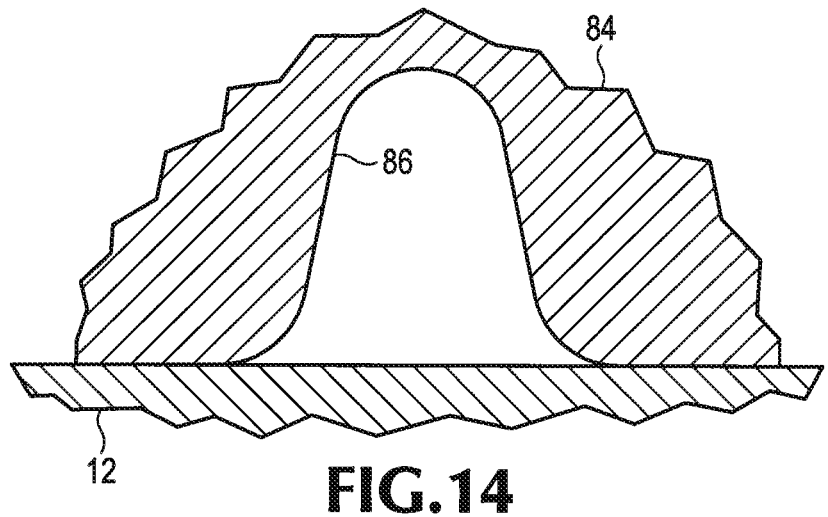
FIG. 14 is an enlarged cross-sectional view taken along line 14-14 in FIG. 12.
Figure 15:
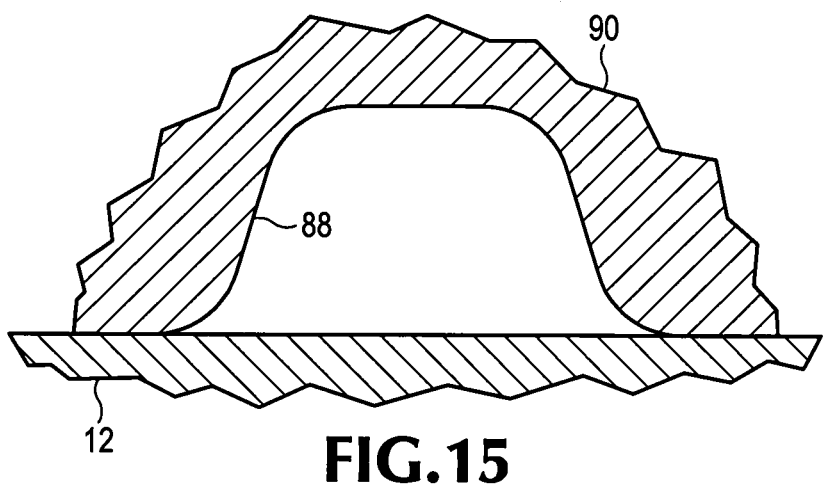
FIG. 15 is a view similar to FIG. 14 of an alternative embodiment.

Groove 86 in FIG. 13 has the same shape as the previously described susceptor groove in FIGS. 6 and 8, but is formed in crucible 84. Groove 86 is shown in more detail in FIG. 14. FIG. 15, which is a view similar to FIG. 14, depicts another embodiment of a different crucible groove 88 formed in a crucible 90. Groove 88 has the same shape as described for the susceptor groove in FIGS. 7 and 9. As with FIGS. 6 and 7, FIGS. 14 and 15 are depicted after start of the CZ process, as shown in FIG. 13, where the crucible surface beneath melt line 24 is flush against the crucible but before the start of any groove deformation, which is discussed shortly.

Figure 16:
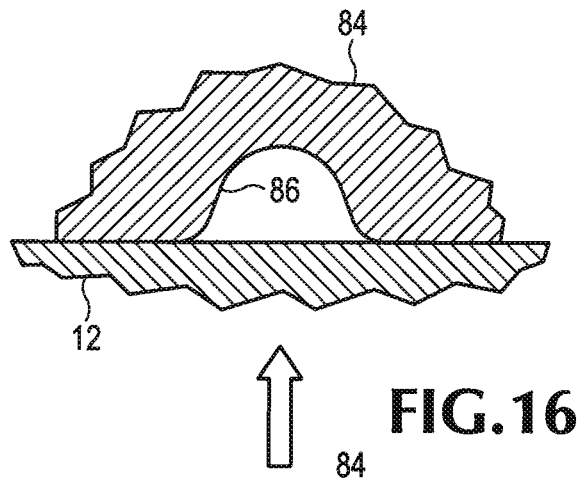
FIG. 16 is a view corresponding to FIG. 14 and depicting deformation of the crucible as a result of heat.
Figure 16:
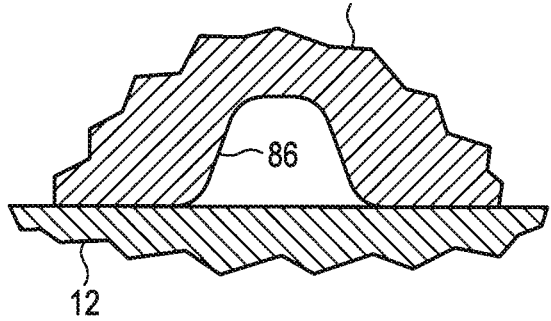

FIG. 16 is a view corresponding to FIG. 14 and depicting the deformation of groove 86 as a result of heating above between about 1580 and 1620 degrees C. As can be seen the groove sags, but maintains an opening through which gas is vented thereby preventing the problems associated with gas pockets.

Figure 17:
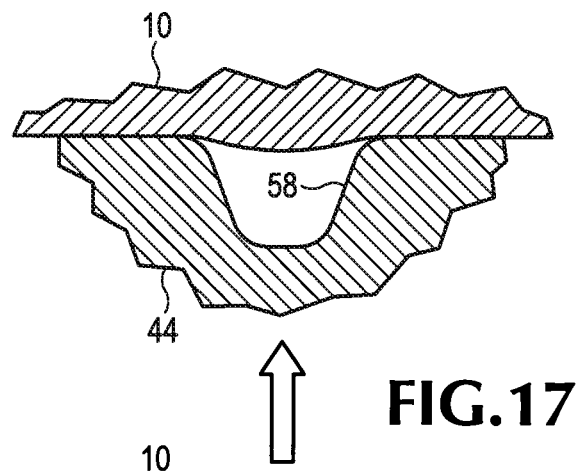
FIG. 17 is a view corresponding to FIG. 15 and depicting deformation of the crucible as a result of heat.
Figure 17:
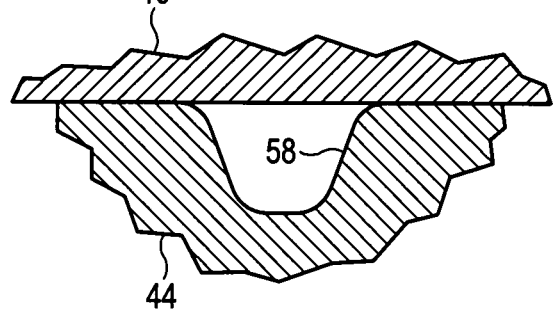

FIG. 17 is a view similar to FIG. 7 and depicts the deformation of crucible 10 as a result of heating above between about 1580 and 1620 degrees C. As can be seen the surface of crucible 10 sags into susceptor groove 58, but an opening is maintained through which gas is vented thereby preventing the problems associated with gas pockets.

Figure 18:
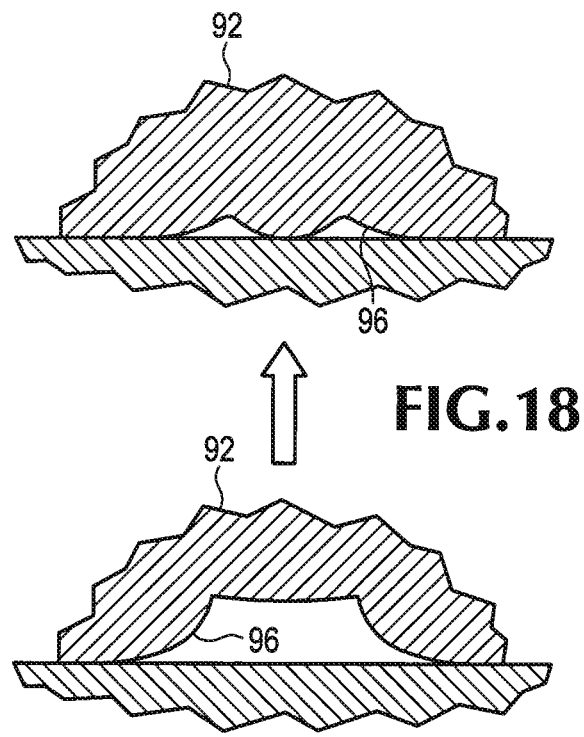
FIGS. 18 and 19 depict alternative embodiments of crucibles showing deformation as a result of heat.
Figure 19:
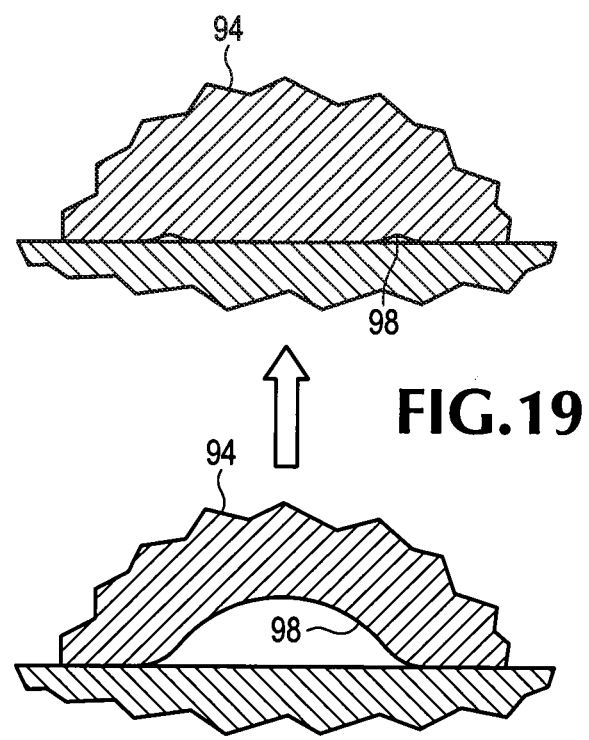

FIGS. 18 and 19 depict alternative embodiments of grooves 96, 98 in crucibles 92, 94, respectively, and show the deformation of the grooves as a result of heating above between about 1580 and 1620 degrees C. As can be seen in FIG. 18, the groove sags, but maintains openings through which gas is vented thereby preventing the problems associated with gas pockets. Groove 98 in FIG. 19, however, substantially collapses as a result of insufficiently sharp transitions between the sidewalls and upper (as viewed in FIG. 19) surface of the groove.

Figure 20:
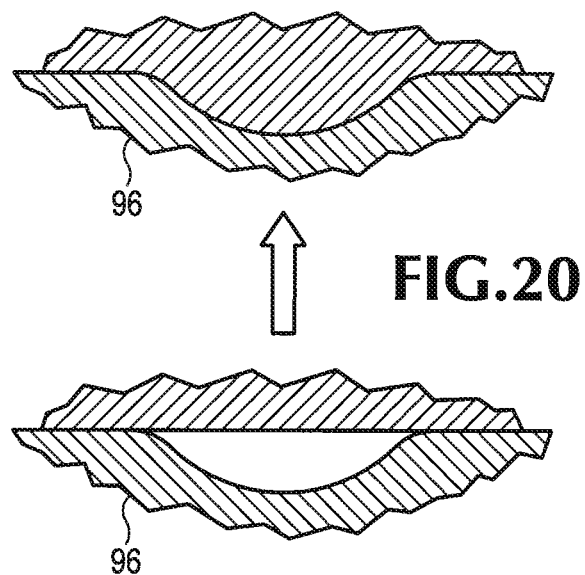
FIGS. 20 and 21 depict alternative embodiments of susceptors showing crucible deformation as a result of heat.
Figure 21:
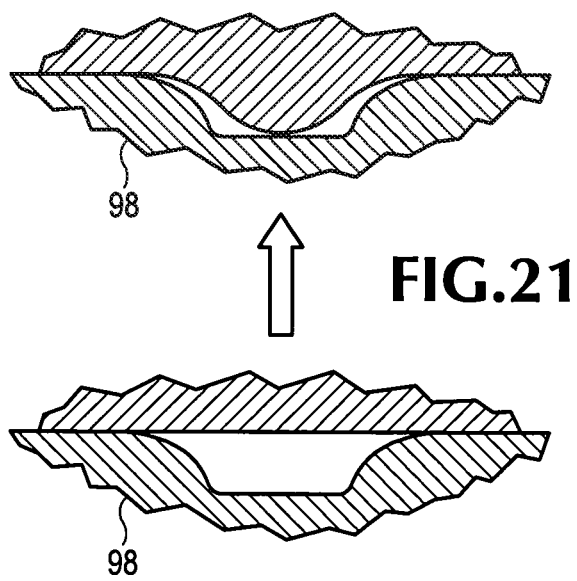

FIGS. 20 and 21 depict alternative embodiments of grooves in susceptors 96, 98 and depicts the deformation of the crucibles above (as viewed in FIGS. 20 and 21) each groove as a result of heating above between about 1580 and 1620 degrees C. As can be seen in FIG. 21, the crucible sags, but maintains an opening through which gas is vented thereby preventing the problems associated with gas pockets. The crucible in FIG. 20, however, substantially collapses as a result of insufficiently sharp transitions between the sidewalls and upper (as viewed in FIG. 20) surface of the susceptor groove.

A crucible groove could also be formed in the shape of the susceptor groove depicted in FIG. 11. It should be appreciated that many different groove sizes and shapes, in either the crucible or susceptor or both, may implement the invention. Also the shape and size of the grooves may vary depending upon the temperature, the roughness of the susceptor and crucible surfaces that face one another. For example, if one or both surfaces are relatively smooth, the groove and groove cell sizes may advantageously made smaller. And if the surfaces or one of the surfaces is relatively rough the groove and cell size may be larger.

Figure 22:
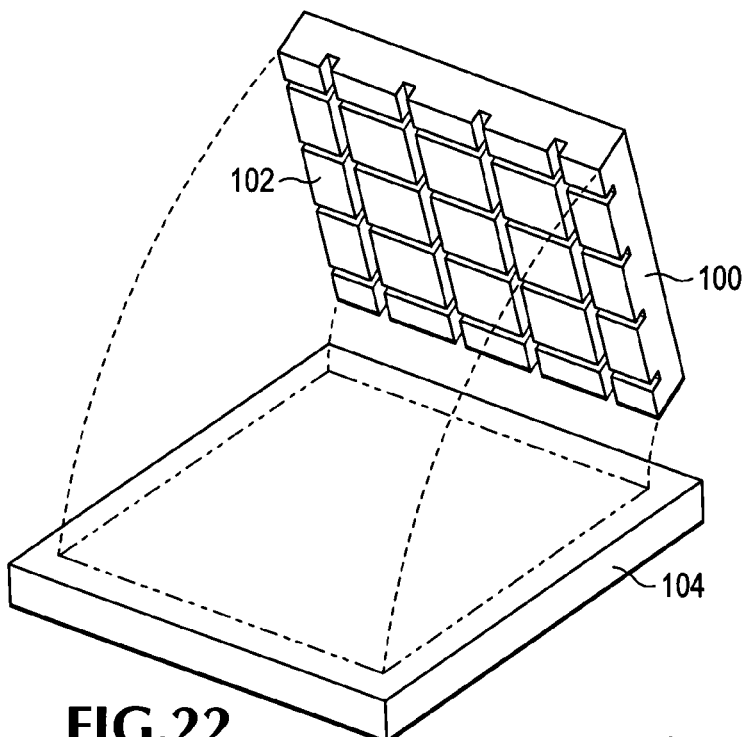
FIG. 22 shows a grooved crucible sample and a susceptor sample used for testing.
Figure 23:
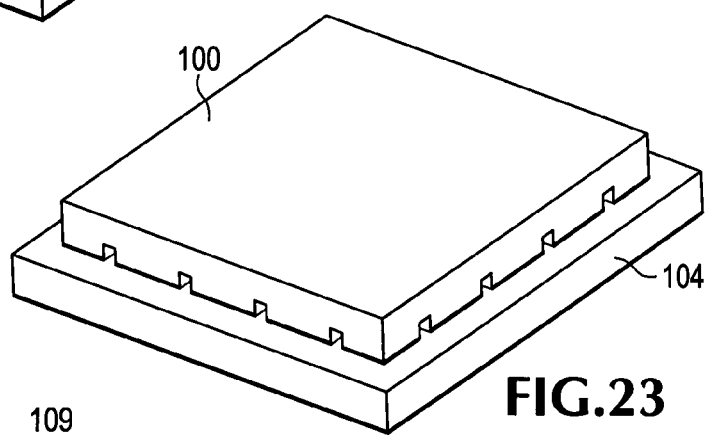
FIG. 23 shows the crucible and susceptor sample of FIG. 22 in position for testing.

Consideration will now be given to some tests and examples related to the present invention. In FIGS. 22 and 23, a 15 cm by 20 cm crucible piece 100 was sandblasted to form a network of grooves as shown. The grooves are formed substantially like groove 88 in FIG. 15. Each fully formed cell is 50 mm by 50 mm with the cell in each corner, like cell 102, being 25 mm by 25 mm. The grooves are 1.6 mm wide by 3.4 mm in depth. Piece 100 was placed on a corresponding piece 104 of a susceptor as shown in FIG. 23 and heated at 1650 degrees C. for 2 hours at 1 mbar argon pressure.

Figure 24:
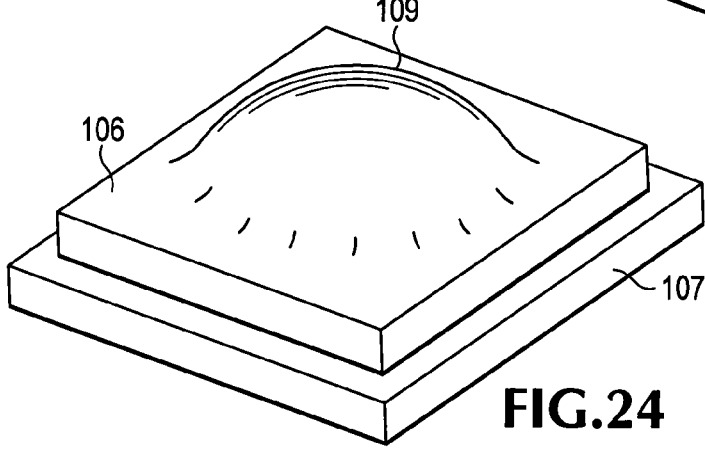
FIG. 24 shows an ungrooved crucible sample and susceptor sample after testing.

In FIG. 24, a portion 106 of a crucible is shown positioned on a portion 107 of a susceptor. These portions were placed in small furnace in the position shown. The furnace included a pressure sensor to monitor gas evolution. Temperature in the furnace was gradually raised to simulate the CZ process. At 1500 degrees Centigrade, portion 106 was not deformed, i.e., no bubble had formed, and the pressure sensor did not detect any gas evolution. By the time the temperature reached 1650 degrees Centigrade, significant gas evolution was detected and a bubble 109 was formed between crucible portion 106 and susceptor portion 107 thus creating a raised surface on crucible portion 106. Further experiments resulted in a determination that gas evolution begins at about 1580-1620 degrees Centigrade.

In a first example, a silica glass crucible was made having a 558 mm outer diameter, a 558 mm bottom radius, and a 90 mm torus radius was fused with a wall thickness of 11 mm. The fused part was cut to 385 mm in height. It should be noted that the torus is the transition between the crucible side, which has the 558 mm outer diameter, and the bottom. Using a stencil, the outer surface of the crucible was sand blasted to form grooves like those in the crucible 84 in FIG. 12. Each groove is about 1 mm in depth and 3 mm wide and with shoulders of about 0.5 mm, which correspond to radius 60 on shoulder 62 and the second symmetrical shoulder in FIG. 8. Each cell in the grid formed by the grooves is approximately 50 mm square as shown in FIG. 22. During the melt process, the heater was held at 1700 degrees C. and then lowered close to the melting point of silicon, 1414 degrees C. The seeding and shoulder making process did not experience any problems in the first example. In sum, gas pockets of a size sufficient to disrupt the process were not formed.

In a second example, a silica glass crucible was made having an 810 mm outer diameter, an 810 mm bottom radius, and a 160 mm torus radius was fused with a wall thickness of 14 mm. The fused part was cut to 555 mm in height. Using a stencil, the outer surface of the crucible was sand blasted to form grooves like those in the crucible 84 in FIG. 12 Each cell in the grid formed by the grooves is approximately 50 mm square as shown in FIG. 22. Semiconductor grade silicon was charged to produce 300 mm wafers. During the melt process, the heater was held at about 1650 degrees C., and then was lowered during the seeding and shoulder making process. The seeding and shoulder making process did not experience any problems.

In a third example, grooves were mechanically formed using a disc grinder with a diamond tool on an inner surface of a graphite receptor with the same dimensions as the first example. The CZ process was also successful in this example.

Finally, in a comparative example, a silica crucible with the same dimensions as the first example was formed, but without grooves. As in the first example, during the melting process the heater was held at 1700 degrees C. Three different trials were required before there was successfully seeding and shoulder making. In another batch, the heater temperature was controlled to be lower than 1550 degrees C. The seeding and shoulder making processes were accomplished without retrials, but took twice as much time to complete as in the preceding comparative example.

We claim:

1. A method for preparing silicon melt for pulling a single crystal by the Czochralski method comprising:
   placing a quartz crucible into a susceptor, at least one of the outer surface of the crucible and the inner surface of the susceptor having a plurality of vents formed thereon;
   loading a silicon charge into the crucible;
   heating the susceptor, crucible and charge in a furnace until gas is emitted from the outer surface of the crucible; and
   venting the emitted gas upwardly in the vents until it is discharged into the furnace.

2. The method of claim 1 further comprising exhausting the emitted gas from the furnace.

3. The method of claim 1 wherein heating the susceptor, crucible and charge in a furnace until gas is emitted from the outer surface of the crucible comprises heating the furnace to at least a temperature of about 1580 degrees Centigrade.

4. The method of claim 1 wherein the location and size of the vents are sufficient to prevent gas trapped between the outer surface of the crucible and the inner surface of the susceptor from expanding the outer surface of the crucible away from the inner surface of the susceptor.

5. The method of claim 4 further comprising heating the furnace until the silicon charge melts.

6. The method of claim 5 wherein the area in which vents are formed is beneath a melt plane defined by the surface of the melted silicon.

7. The method of claim 6 wherein areas where the outer surface of the crucible contact the inner surface of the susceptor beneath the melt plane are no more than about 25 mm from the nearest vent.

8. The method of claim 1 wherein the vents cross one another to form a plurality of grids.

9. The method of claim 8 wherein areas where the outer surface of the crucible contact the inner surface of the susceptor beneath the melt plane are no more than about 25 mm from the nearest vent.

10. A susceptor for holding a quartz crucible in which a silicon charge is melted, the susceptor comprising:
    a generally bowl-shaped structure sized to receive a crucible in a lower portion thereof, the structure having an inner surface that extends above the upper portion of a crucible that is so received; and
    a plurality of grooves formed on the inner surface of the structure, the grooves having a closed end that extends beneath a melt plane defined by the surface of a melted silicon charge in the crucible and an open end that extends above the charge for upwardly venting gas emitted from the outer surface of the crucible beneath the melt plane when the susceptor, crucible and silicon charge are heated.

11. The susceptor of claim 10 wherein the inner surface of the structure having a plurality of grooves formed thereon beneath the melt plane is no more than about 25 mm from the nearest groove.

12. The susceptor of claim 10 wherein the open end of the grooves terminates below an upper portion of the crucible when it is received in the bowl-shaped structure.

13. The susceptor of claim 10 wherein the grooves cross one another to form a plurality of grids.

14. The susceptor of claim 13 wherein the inner surface of the structure having grooves thereon beneath the melt plane is no more than about 25 mm from the nearest groove.

15. A crucible for melting a silicon charge comprising:
    a generally bowl-shaped structure;
    a plurality of grooves formed on the outer surface of the structure, the grooves having a closed end that extends beneath a melt plane defined by the surface of a melted silicon charge in the crucible and an open end that extends above the melt plane for venting gas emitted from the outer surface of the crucible beneath the melt plane when the crucible is received in a susceptor and heated.

16. The crucible of claim 15 wherein the grooves terminate at an upper end above the melt plane.

17. The crucible of claim 16 wherein the grooves terminate at their upper end beneath an upper portion of the crucible.

18. The crucible of claim 15 wherein the grooves cross one another to form a plurality of grids.

19. The susceptor of claim 18 wherein the outer surface of the crucible having grooves formed thereon beneath the melt plane is no more than about 25 mm from the nearest groove.

20. The susceptor of claim 15 wherein the outer surface of the crucible having grooves formed thereon beneath the melt plane is no more than about 25 mm from the nearest groove.

* * * * *